(12) United States Patent
Lee et al.

(10) Patent No.: US 7,582,535 B2
(45) Date of Patent: Sep. 1, 2009

(54) METHOD OF FORMING MOS TRANSISTOR HAVING FULLY SILICIDED METAL GATE ELECTRODE

(75) Inventors: Seung-Hwan Lee, Seoul (KR); Dong-Suk Shin, Yongin-si (KR); Hwa-Sung Rhee, Seongnam-si (KR); Tetsuji Ueno, Suwon-si (KR); Ho Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 254 days.

(21) Appl. No.: 11/158,978

(22) Filed: Jun. 22, 2005

(65) Prior Publication Data

US 2006/0008961 A1    Jan. 12, 2006

(30) Foreign Application Priority Data

Jul. 12, 2004    (KR) ...................... 10-2004-0054160

(51) Int. Cl.
*H01L 21/336* (2006.01)
(52) U.S. Cl. ................. 438/300; 438/655; 257/E21.622
(58) Field of Classification Search ................. 438/300, 438/651, 655, 657; 257/E21.619, E21.622
See application file for complete search history.

(56) References Cited

U.S. PATENT DOCUMENTS

| 6,190,977 B1 | 2/2001 | Wu ............................ 438/300 |
| 6,599,831 B1 | 7/2003 | Maszara et al. ............. 438/649 |
| 7,067,379 B2 * | 6/2006 | Wen et al. ................... 438/300 |

FOREIGN PATENT DOCUMENTS

| KR | 03-65174 | 8/2003 |
| KR | 03-89742 | 11/2003 |

OTHER PUBLICATIONS

Miyano, Kiyotaka, et al., "SPE$^{79}$2~Novel 700C Selective Epitaxial Growth Technology for Elevated Source/Drain," Extended Abstracts of International Workshop on Junction Technology 2001, Japan Society of Applied Physics, vol. 5, No. 2, pp. 1-4.
Tavel, B., et al., "Totally Silicided (CoSi2) Polysiclicon: A Novel Approach to Very Low-Resistive Gate Without Metal CMP Nor Etching," IEEE, vol. 37., No. 5, 2001. pp. 1-4.

* cited by examiner

*Primary Examiner*—Chandra Chaudhari
(74) *Attorney, Agent, or Firm*—Mills & Onello, LLP

(57) ABSTRACT

Methods of fabricating a MOS transistor having a fully silicided metal gate electrode are provided. The method includes forming an isolation layer in a predetermined region of a semiconductor substrate to define an active region. An insulated gate pattern which crosses over the active region is formed. A spacer is formed on sidewalls of the gate pattern. A selective epitaxial growth process is applied to form semiconductor layers on the gate pattern and on the active region at both sides of the gate pattern. In this case, a poly-crystalline semiconductor layer is formed on the gate pattern while single-crystalline semiconductor layers are concurrently formed on the active region at both sides of the gate pattern. The semiconductor layers are selectively etched to form a gate-reduced pattern and elevated source and drain regions. Respective desired thicknesses of the gate-reduced pattern and the elevated source and drain regions may be obtained using an etch selectivity between the poly-crystalline semiconductor layer and the single-crystalline semiconductor layer. A silicidation process is applied to the semiconductor substrate where the gate-reduced pattern is formed to simultaneously form a fully silicided metal gate electrode and elevated source and drain silicide layers.

15 Claims, 5 Drawing Sheets

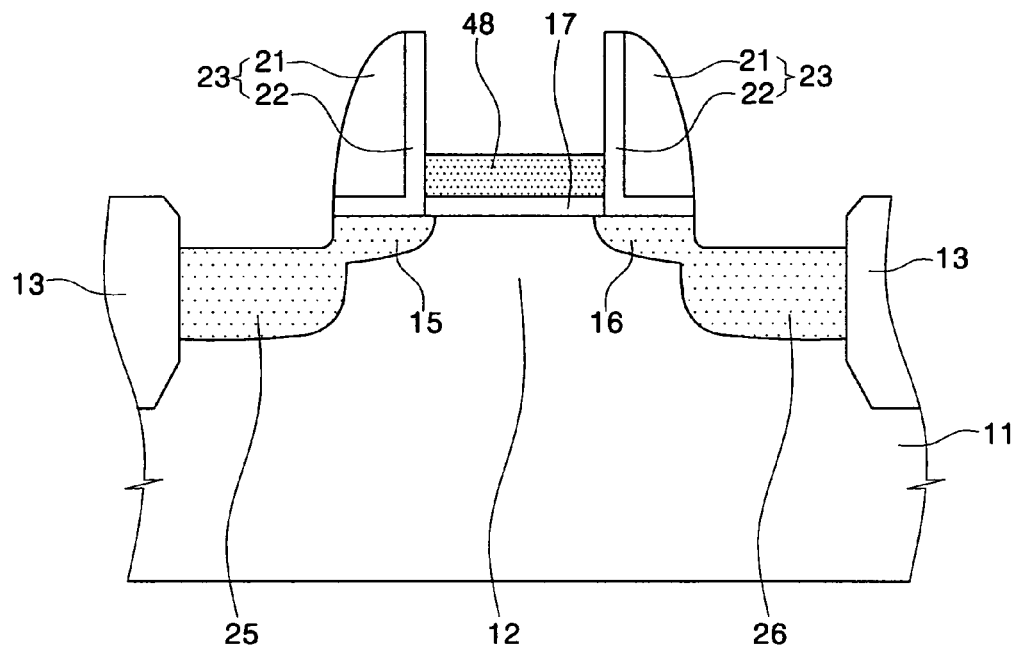
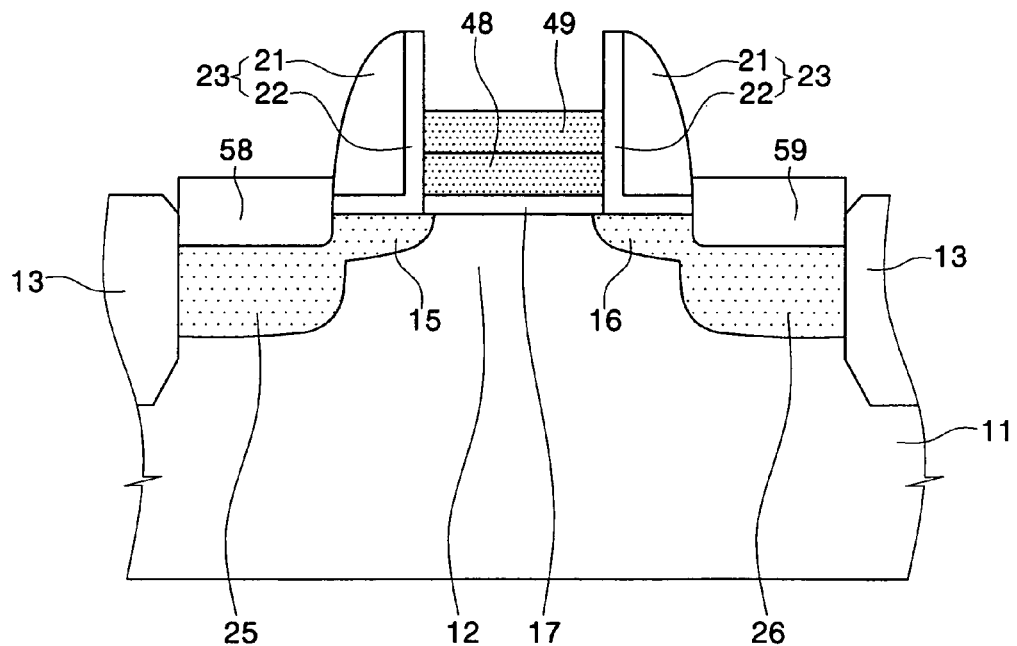

METHOD OF FORMING MOS TRANSISTOR HAVING FULLY SILICIDED METAL GATE ELECTRODE

CROSS-REFERENCE TO RELATED APPLICATION

This application claims the benefit of Korean Patent Application No. 2004-0054160, filed Jul. 12, 2004, the contents of which are hereby incorporated herein by reference in their entirety.

BACKGROUND OF THE INVENTION

1. Field of the Invention

The present invention relates to a method of fabricating a semiconductor device and, more particularly, to a method of fabricating a metal oxide semiconductor (MOS) transistor having a fully silicided metal gate electrode.

2. Description of the Related Art

As electronic products employing semiconductor devices require light weight and small size, high integration density per unit area, low threshold voltage Vth, fast operating speed and low power consumption. Discrete devices such as MOS transistors are widely employed as switching devices for the semiconductor devices. To meet the requirement of the high integration, a gate of a transistor, source and drain junctions of the transistor, and interconnections should be reduced in size as much as possible within a possible range. In addition, the size of interconnections between the transistors should be also reduced.

However, the reduction of the transistor size has several associated difficulties. By way of example, the electrical resistance increases when the gate electrode is reduced. In this case, the transmission speed of an electrical signal applied to the gate electrode is delayed due to a resistance-capacitance (RC) delay time. In addition, a short channel effect occurs due to the reduction of the channel length.

To reduce the short channel effect, it is advantageous to form shallow source and drain junction depths and to form a thin gate insulating layer. However, the formation of the shallow source and drain junction depths causes an increase in sheet resistance of the source and drain. The increase of the sheet resistance in turn causes the current driving capability of the transistor to be degraded.

In the prior art of employing polysilicon for the gate electrode, the reduction of the gate electrode size further raises problems such as polysilicon depletion and boron penetration. In this case, the polysilicon depletion indicates a depletion region adjacent to the gate insulating layer, i.e., a lower region within the polysilicon gate electrode. The polysilicon depletion region serves as an additional capacitance which is serially connected to the capacitance of the gate insulating layer. As a result, the polysilicon depletion region causes the electrical equivalent thickness of the gate insulating layer to be increased. The increase of the electrical equivalent thickness means a decrease of an effective gate voltage. In the prior art of employing the thick gate insulating layer, since the thickness of the polysilicon depletion region is relatively very small compared to the effective thickness of the thick gate insulating layer, its effect may be negligible. However, when a thin gate insulating layer is used, the decrease in effective gate voltage due to the polysilicon depletion is raised as a serious problem.

The use of metal instead of polysilicon for the gate of the transistor has several advantages. For example, the metal material has a very high conductivity, and may avoid gate depletion and boron penetration. However, the metal gate causes the gate insulating layer to be degraded due to metal ions, and its work function is constant, which makes it difficult to adjust the threshold voltage Vth. For example, a semiconductor device such as a complementary MOS (CMOS) transistor has an N-MOS transistor region and a P-MOS transistor region within a single chip. Each threshold voltage of the N-MOS and P-MOS transistors should be adjusted to be different from each other. Consequently, a metal gate employed for the N-MOS transistor region should be different from that employed for the P-MOS transistor region, which makes the process very complicated.

To implement a high performance MOS transistor suitable for the highly integrated semiconductor device, research has been conducted on self-aligned silicide, i.e., salicide, technology. The salicide technology is a process of forming a metal silicide layer on the gate electrode and the source and drain regions to reduce electrical resistance of the gate electrode and the source and drain regions.

In this case, a metal gate may be formed when the gate electrode is fully transformed to a metal silicide, and the fully silicided metal may be implemented in N and P doped states even when the problematic N-MOS and P-MOS transistors are formed as mentioned above, which leads to a difference between work functions for the N-MOS and the P-MOS, so that the drawbacks of a metal gate may be overcome.

The metal silicide layer is also formed on the source and drain regions while the gate electrode is transformed to the silicide. When the thickness of the source/drain metal silicide layer is larger than the source and drain junction depth, leakage current occurs. Consequently, there exists a need for a technology capable of preventing the deep silicide layer from being formed in the source and drain regions while the gate electrode is fully transformed to silicide.

A method of forming a metal gate electrode using silicide is disclosed in U.S. Pat. No. 6,599,831B1 entitled "Metal gate electrode using silicidation and method of formation thereof" to Maszara et al.

FIG. 1 and FIG. 2 are cross-sectional views illustrating drawbacks to a method of fabricating a metal gate electrode using the silicide disclosed in U.S. Pat. No. 6,599,831B1.

Referring to FIG. 1, a gate electrode 86 and a capping layer 90 are sequentially stacked above a predetermined region of a semiconductor substrate 82. A gate insulating layer 84 is interposed between the gate electrode 86 and the semiconductor substrate 82. The gate electrode 86 is formed of doped polysilicon. First impurity ions are implanted into an active region of the semiconductor substrate 82 using the capping layer 90 as a mask to form lightly doped drain (LDD) regions 94 and 96. Spacers 104 and 106 surrounding sidewalls of the gate insulating layer 84, the gate electrode 86, and the capping layer 90 are then formed. Second impurity ions are implanted into the active region of the semiconductor substrate 82 using the capping layer 90 and the spacers 104 and 106 as masks to form source and drain regions 112 and 114.

Referring to FIG. 2, the capping layer 90 is selectively etched to expose the gate electrode 86. Next, a metal layer covering the gate electrode 86 and the source and drain regions 112 and 114 is formed, and a silicidation process is carried out.

However, to prevent the spacers 104 and 106 from being damaged while the capping layer 90 is etched, the capping layer 90 should be formed of a material having a high etch selectivity with respect to the spacers 104 and 106. Nevertheless, it is not easy to remove the capping layer 90. For example, when the capping layer 90 is an oxide layer, a trench isolation layer which is to be concurrently exposed may be damaged. Alternatively, when the capping layer 90 is a nitride layer, a trench liner which is to be concurrently exposed may be damaged.

In addition, when the capping layer 90 is not completely removed, it cannot be expected that the gate electrode 86 is fully transformed to silicide.

SUMMARY OF THE INVENTION

Embodiments of the invention provide a method of fabricating a MOS transistor which is capable of preventing a deep silicide layer from being formed in source and drain regions while a gate electrode is fully transformed to silicide.

In one aspect, the invention is directed to a method of fabricating a MOS transistor. In accordance with the method, an isolation layer is formed in a predetermined region of a semiconductor substrate to define an active region. A gate insulating layer is formed on the active region. An insulated gate pattern is formed to cross over the active region. A spacer is formed on sidewalls of the gate pattern. A selective epitaxial growth process is applied to form semiconductor layers on the gate pattern and on the active region at both sides of the gate pattern. A poly-crystalline semiconductor layer is grown on the gate pattern while single-crystalline semiconductor layers are concurrently grown on the active region at both sides of the gate pattern. The semiconductor layers are selectively etched to form a gate-reduced pattern and elevated source and drain regions. A silicidation process is applied where the gate-reduced pattern is formed to simultaneously form a fully silicided metal gate electrode and elevated source and drain silicide layers.

In one embodiment, the semiconductor substrate is one of a silicon substrate, a silicon-on-insulator (SOI) substrate and a strained silicon substrate.

The gate pattern can be formed of a poly-crystalline semiconductor layer which can be doped with N type impurities or P type impurities.

First impurity ions can be implanted into the active region using the gate pattern and the isolation layer as ion implantation masks to form lightly doped drain (LDD) regions after forming the gate pattern. The first impurity ions may be N type impurity ions or P type impurity ions.

Second impurity ions can be implanted into the active region using the gate pattern, the spacer, and the isolation layer as ion implantation masks to form source and drain regions after forming the spacer on the sidewalls of the gate pattern. The second impurity ions can also be N type impurity ions or P type impurity ions. The spacer can be formed of at least one of a silicon oxide layer, a silicon nitride (SiN) layer, and a silicocn oxynitride (SiON) layer. The structure can be annealed in a chamber to which a $H_2$ gas is supplied at a temperature of 800 degrees C. to 1000 degrees C. after forming the source and drain regions. Next, it is preferable to clean the surface of the semiconductor substrate where the source and drain regions are formed to remove a native oxide layer and contaminated particles which remain on the source and drain regions. In this case, some of bonding structures of silicon atoms in the source and drain regions and the gate pattern may be damaged while the ion implanting process and the cleaning process are carried out. Accordingly, it is preferable to anneal the cleaned semiconductor substrate to rearrange the bonding structures of the silicon atoms which are arranged on the exposed surfaces of the source and drain regions and the gate pattern. The annealing may be carried out in a chamber to which $H_2$ is supplied at a heating temperature in a range of 800° C. to 1000° C.

The selective epitaxial growth process may be carried out using a chemical vapor deposition (CVD) apparatus. A reduced pressure chemical vapor deposition (RPCVD) apparatus, a low pressure chemical vapor deposition (LPCVD) apparatus, an ultra high vacuum chemical vapor deposition (UHVCVD) apparatus, or a metal organic chemical vapor deposition (MOCVD) apparatus may be used as the CVD apparatus.

The semiconductor layers may be formed of at least one material selected from a group consisting of silicon (Si), silicon germanium (SiGe), silicon carbide (SiC), carbon (C) doped silicon germanium (SiGe), phosphor (P) doped SiGe, and boron (B) doped SiGe. For example, when the Si is employed as a material for forming the semiconductor layers, a di chloro silane (DCS; $SiH_2Cl_2$) gas may be used as a reaction gas which is injected into the CVD apparatus. When SiGe is employed as a material for forming the semiconductor layers, $SiH_2Cl_2$ and germanium tetra hydride ($GeH_4$) gases may be used as reaction gases to be injected into the CVD apparatus.

The selective etching process may be carried out as an in-situ process. That is, it is preferable to perform the selective etching process and the selective epitaxial growth process continuously using the same apparatus. The selective etching process may be carried out using HCl and $H_2$ gases as reaction gases and may be carried out under conditions of 700° C. to 1000° C. in temperature and 10 torr to 600 torr in pressure. The selective etching process may allow the temperature, the pressure, and the reaction gases to be adjusted to thereby change an etch selectivity between the single-crystalline semiconductor layer and the poly-crystalline semiconductor layer. The gate-reduced pattern and the elevated source and drain regions may have respective desired thicknesses by means of the etch selectivity between the single-crystalline semiconductor layer and the poly-crystalline semiconductor layer. In this case, it is preferable to form the elevated source and source regions to be protruded from the surface of the semiconductor substrate.

The selective epitaxial growth process and the selective etching process may also be repeated one or more times to form respective desired thicknesses of the gate-reduced pattern and the elevated source and drain regions.

In one embodiment, applying the silicidation process to the semiconductor substrate where the gate-reduced pattern is formed to simultaneously form the fully silicided metal gate electrode and the elevated source and drain silicide layers, includes: forming a metal layer on an entire surface of the semiconductor substrate where the gate-reduced pattern is formed; annealing the semiconductor substrate until the gate-reduced pattern is fully silicided; and removing a metal layer which was unreacted on the spacer and the isolation layer.

In one embodiment, the metal layer is formed of one material selected from a group consisting of nickel (Ni), cobalt (Co), tungsten (W,) tantalum (Ta), titanium (Ti), and an alloy layer containing at least two materials selected from the group.

In one embodiment, the elevated source and drain silicide layers are formed to be protruded from a surface of the semiconductor substrate.

In accordance with another aspect, the invention is directed to a method of fabricating a MOS transistor having a fully silicided metal gate electrode. The method includes forming an isolation layer in a predetermined region of a semiconductor substrate to define an active region. An insulated gate pattern is formed to cross over the active region. A spacer is formed on sidewalls of the gate pattern. The gate pattern and the active region at both sides of the gate pattern are selectively etched to form a lower gate-reduced pattern and recessed source and drain regions. A selective eptiaxy growth process is applied to form an upper gate pattern and elevated source and drain regions on the lower gate-reduced pattern and the recessed source and drain regions, respectively. In one embodiment, a poly-crystalline semiconductor layer is grown on the lower gate-reduced pattern while single-crystalline semiconductor layers are concurrently grown on the recessed source and drain regions. A silicidation process is applied where the upper gate pattern and the elevated source and drain regions are formed to simultaneously form a fully silicided metal gate electrode and elevated source and drain silicide layers.

It is preferable to perform the selective etching process and the selective epitaxial growth process in the same apparatus. The selective etching process may be carried out using a chemical vapor deposition (CVD) apparatus. The selective etching process may be carried out using HCl and $H_2$ gases as reaction gases and may be carried out under conditions of 700° C. to 1000° C. in temperature and 10 torr to 600 torr in pressure. The selective etching process may allow the temperature, the pressure, and the reaction gases to be adjusted to thereby change an etch selectivity between the single-crystalline semiconductor layer and the poly-crystalline semiconductor layer.

The selective etching process may be carried out as an in-situ process. That is, it is preferable to perform the selective epitaxial growth process continuously using the CVD apparatus which was employed while the selective etching process was carried out.

In addition, the selective epitaxial growth process and the selective etching process may also be repeated one or more times to form desired thicknesses of the upper gate pattern and the elevated source and drain regions. In this case, it is preferable to form the elevated source and drain regions to be protruded from the surface of the semiconductor substrate.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity. In addition, when a layer is described to be formed on another layer or on a substrate, the layer may be formed on the other layer or on the substrate, or a third layer may be interposed between the layer and the other layer or the substrate.

FIGS. 9 and 10 are cross-sectional views illustrating a method of fabricating a MOS transistor having a fully silicided metal gate electrode in accordance with other embodiments of the present invention.

DETAILED DESCRIPTION OF THE INVENTION

FIG. 3 to FIG. 8 are cross-sectional views illustrating a method of fabricating a MOS transistor having a fully silicided metal gate electrode in accordance with embodiments of the present invention.

Figure 1:
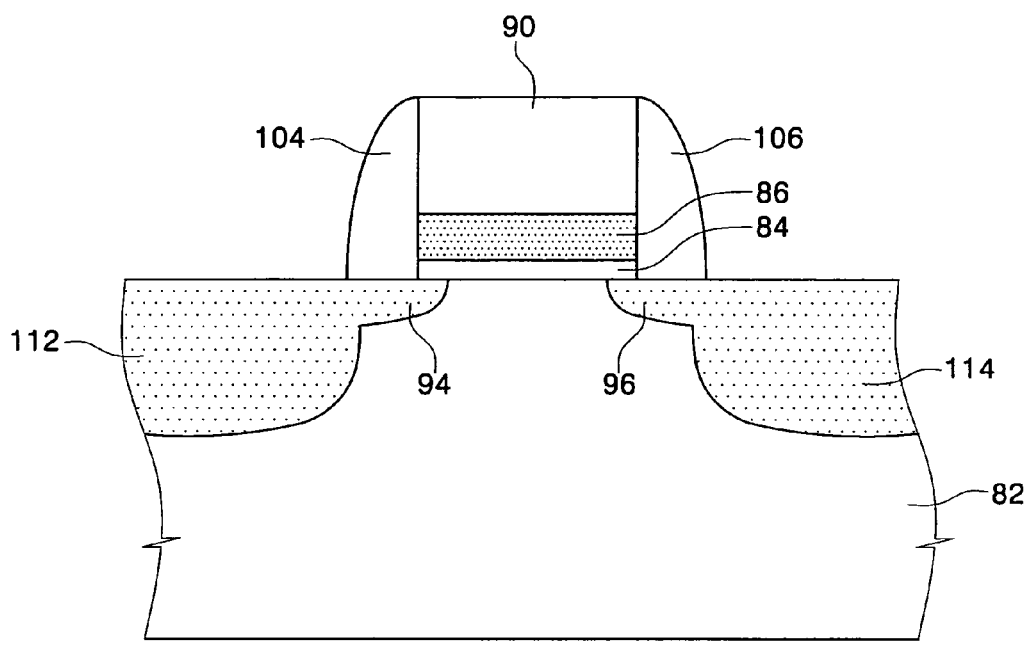
FIGS. 1 and 2 are cross-sectional views illustrating drawbacks to a method of fabricating a metal gate electrode using conventional silicide.
Figure 2:
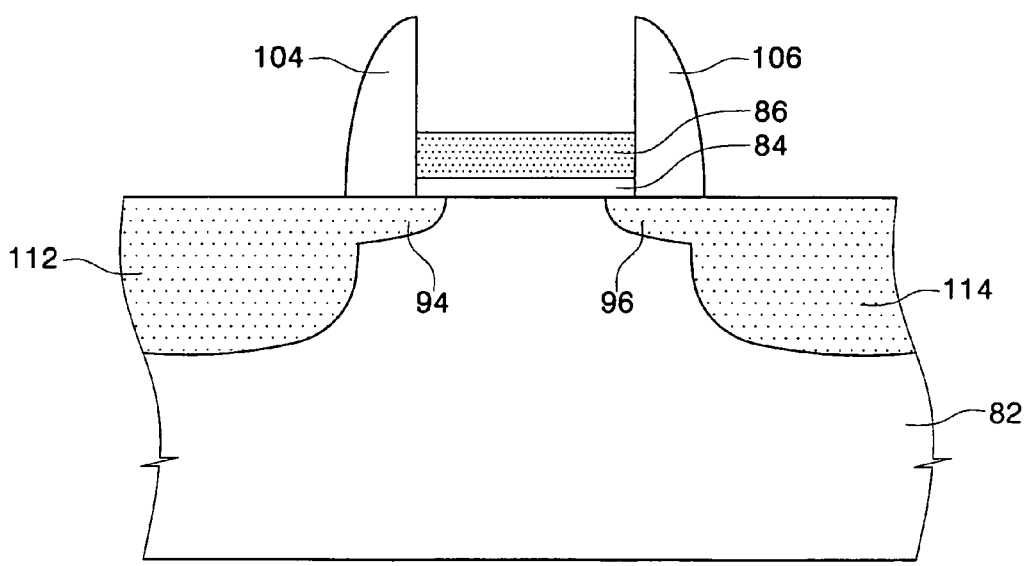
Figure 3:
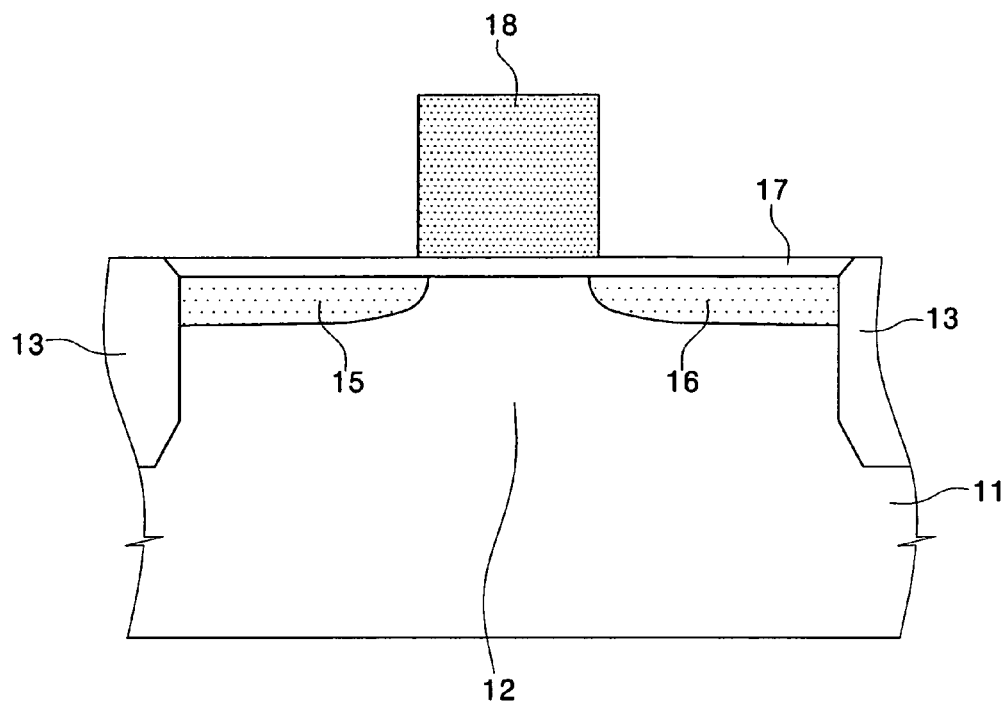
FIGS. 3 to 8 are cross-sectional views illustrating a method of fabricating a MOS transistor having a fully silicided metal gate electrode in accordance with embodiments of the present invention.

Referring to FIG. 3, an isolation layer 13 is formed in a predetermined region of a semiconductor substrate 11 to define an active region 12. The semiconductor substrate 11 may be a silicon substrate or a silicon-on-insulator (SOI) substrate. Moreover, the semiconductor substrate 11 may be a strained silicon substrate containing germanium (Ge) or carbon (C). A gate insulating layer 17 is formed on the active region 12. A gate conductive layer is formed on the entire surface of the semiconductor substrate having the gate insulating layer 17. The gate conductive layer may be formed of a poly-crystalline semiconductor layer which is doped with N type impurities or P type impurities.

The gate conductive layer is patterned to form a gate pattern 18 which crosses over the active region 12. First impurity ions are then implanted into the active region 12 using the gate pattern 18 and the isolation layer 13 as ion implantation masks to form LDD regions 15 and 16. The first impurity ions may be N type impurity ions or P type impurity ions.

Figure 4:
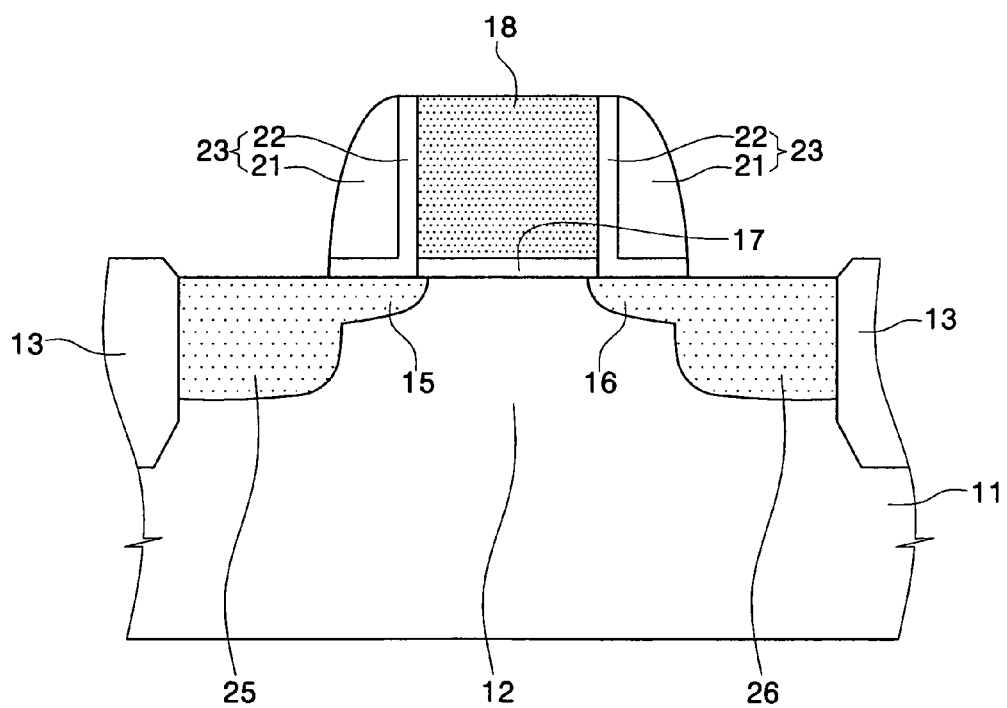

Referring to FIG. 4, a spacer insulating layer is formed on the entire surface of the semiconductor substrate having the LDD regions 15 and 16.

A cleaning process for removing surface contaminated particles may be performed on the semiconductor substrate prior to formation of the spacer insulating layer. An exposed portion of the gate insulating layer 17 may be etched to be removed while the cleaning process is carried out. That is, the gate insulating layer 17 may be present only below the gate pattern 18.

The spacer insulating layer may be formed of at least one material layer selected from a group consisting of a silicon oxide layer, a silicon nitride (SiN) layer, and a silicon oxynitride (SiON) layer. The spacer insulating layer is anisotropically etched to form spacers 23 on sidewalls of the gate pattern 18. For simplicity of description, it is hereinafter assumed that each spacer 23 is formed of a silicon oxide layer 22 and a silicon nitride layer 21 which are sequentially stacked.

Second impurity ions are implanted into the active region 12 using the gate pattern 18, the spacers 23, and the isolation layer 13 as ion implantation masks to form source and drain regions 25 and 26. As a result, the LDD regions 15 and 16 still remain below the spacers 23. The second impurity ions may also be N type impurity ions or P type impurity ions.

Figure 5:
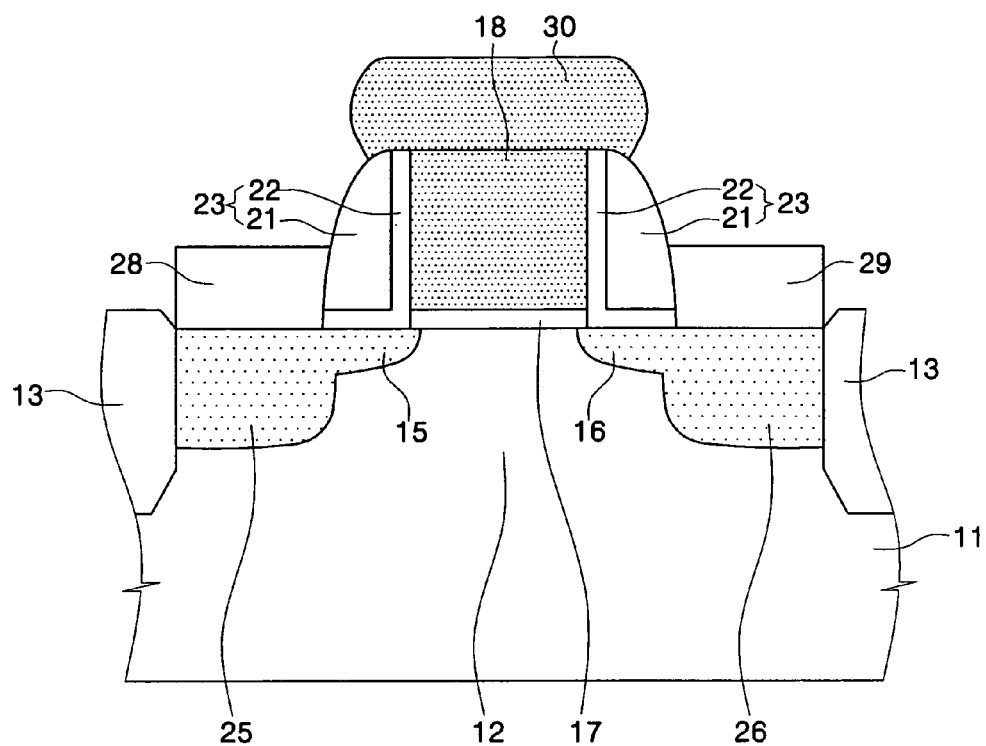

Referring to FIG. 5, the surface of the semiconductor substrate where the source and drain regions 25 and 26 are already formed is subjected to a cleaning process to remove a native oxide layer and contaminated particles which remain on the source and drain regions 25 and 26.

The cleaning process may be performed such that a first cleaning step is carried out using a wet cleaning solution in which HF is contained and a second cleaning step is carried out using a-solution mixed with $NH_4OH$, $H_2O_2$ and $H_2O$. The wet cleaning solution in which the HF is contained has high removal efficiency with respect to the native oxide layer. The mixed solution simultaneously has an oxidation reaction due to $H_2O_2$ and an etching reaction due to $NH_4OH$. The $NH_4OH$ etches the silicon and has a very high etching speed. In addition, surface oxidation due to $H_2O_2$ serves to alleviate the roughness of silicon surface.

In the meantime, some of bonding structures of silicon atoms in the source and drain regions 25 and 26 and the gate pattern 18 may be damaged while the ion implanting process and the cleaning process are carried out. Accordingly, it is preferable to anneal the cleaned semiconductor substrate to rearrange the bonding structures of the silicon atoms which are arranged on the exposed surfaces of the source and drain regions 25 and 26 and on the exposed surface of the gate pattern 18. The annealing may be carried out within a chamber to which $H_2$ is supplied at a heating temperature in a range of 800° C. to 1000° C.

Next, a selective epitaxial growth process is performed on the annealed semiconductor substrate to form semiconductor layers 28, 29, and 30. In this case, single-crystalline semiconductor layers 28 and 29 are grown on the source and drain regions 25 and 26 while a poly-crystalline semiconductor layer 30 is concurrently grown on the gate pattern 18.

The selective epitaxial growth process may be carried out using a chemical vapor deposition (CVD) apparatus. A reduced pressure chemical vapor deposition (RPCVD) apparatus, a low pressure chemical vapor deposition (LPCVD) apparatus, an ultra high vacuum chemical vapor deposition (UHVCVD) apparatus, or a metal organic chemical vapor deposition (MOCVD) apparatus may be used as the CVD apparatus. For example, the selective epitaxial growth process may be carried out using the RPCVD apparatus under conditions of 700° C. to 900° C. in temperature and 10 torr to 50 torr in pressure.

The semiconductor layers 28, 29, and 30 may be formed of at least one material selected from a group consisting of Si, SiGe, SIC, C doped SiGe, P doped SiGe, and B doped SiGe.

For example, when the Si is employed as a material for forming the semiconductor layers 28, 29, and 30, a di chloro silane (DCS; $SiH_2Cl_2$) gas may be used as a reaction gas which is injected into the CVD apparatus. When the SiGe is employed as a material for forming the semiconductor layers 28, 29, and 30, $SiH_2Cl_2$ and germanium tetra hydride ($GeH_4$) gases may be used as reaction gases which are injected into the CVD apparatus. When the SiC is employed as a material for forming the semiconductor layers 28, 29, and 30, $SiH_2Cl_2$ and methyl silane ($CH_3SiH_3$) gases may be used as reaction gases which are injected into the CVD apparatus. When the C doped SiGe is employed as a material for forming the semiconductor layers 28, 29, and 30, $SiH_2Cl_2$, $GeH_4$, and $CH_3SiH_3$ gases may be used as reaction gases which are injected into the CVD apparatus.

Hereinafter, it is assumed that the Si is employed as a material for forming the semiconductor layers 28, 29, and 30 for simplicity of description.

Figure 6:
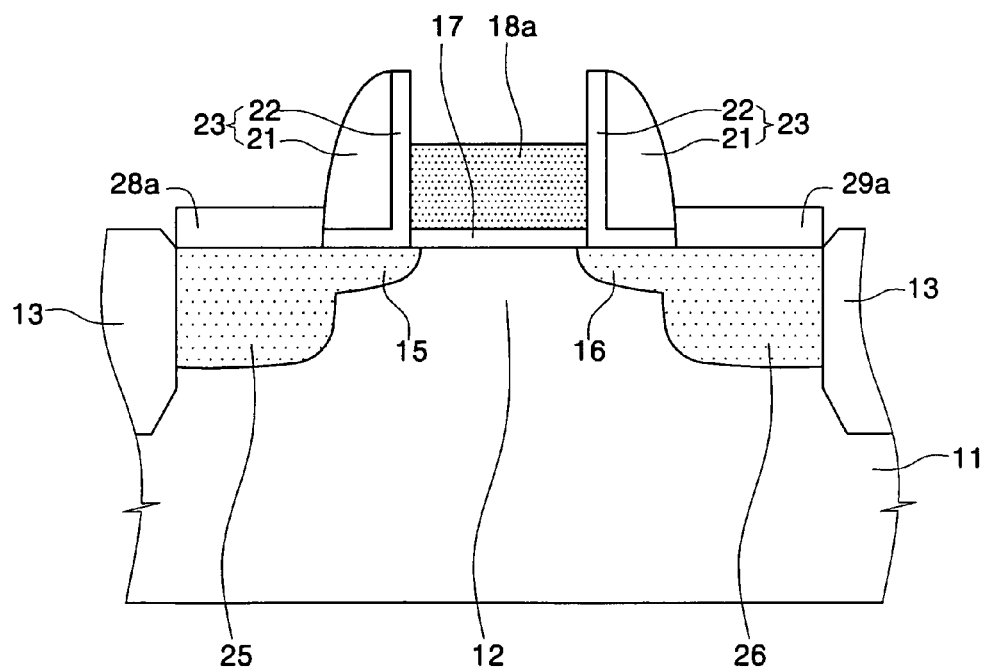

Referring to FIG. 6, a selective etching process is performed on the semiconductor substrate where the semiconductor layers 28, 29, and 30 are already formed to form a gate-reduced pattern 18a and elevated source and drain regions 28a and 29a.

The selective etching process may be carried out as an in-situ process. That is, it is preferable to perform the selective etching process continuously using the CVD apparatus which was employed while the semiconductor layers 28, 29, and 30 were grown. The in-situ etching process may be carried out using HCl and $H_2$ gases as reaction gases under conditions of 700° C. to 1000° C. in temperature and 10 torr to 600 torr in pressure. The selective etching process may allow the temperature, the pressure, and the reaction gases to be adjusted to thereby change an etch selectivity between the single-crystalline semiconductor layer and the poly-crystalline semiconductor layer. The HCl gas may be supplied at a flow of 300 standard cubic centimeter per minute (sccm) to 1500 sccm. For example, when the HCl gas of 300 sccm is supplied under conditions of 780° C. in temperature and 550 torr in pressure, an etch selectivity of one to five may be obtained between the single-crystalline semiconductor layer and the poly-crystalline semiconductor layer. That is, the poly-crystalline semiconductor layer is etched five times faster than the single-crystalline semiconductor layer.

The gate-reduced pattern 18a and the elevated source and drain regions 28a and 29a may have respective desired thicknesses by means of the etch selectivity between the single-crystalline semiconductor layer and the poly-crystalline semiconductor layer. In this case, it is preferable to form the elevated source and drain regions 28a and 29a to be protruded from the surface of the semiconductor substrate. For example, the gate-reduced pattern 18a may be formed to a thickness of 300 Å to 600 Å, and the elevated source and drain regions 28a and 29a may be formed to thicknesses of 100 Å to 400 Å.

In addition, the selective epitaxial growth process and the selective etching process may be performed at least two times to form respective desired thicknesses of the gate-reduced pattern 18a and the elevated source and drain regions 28a and 29a.

Figure 7:
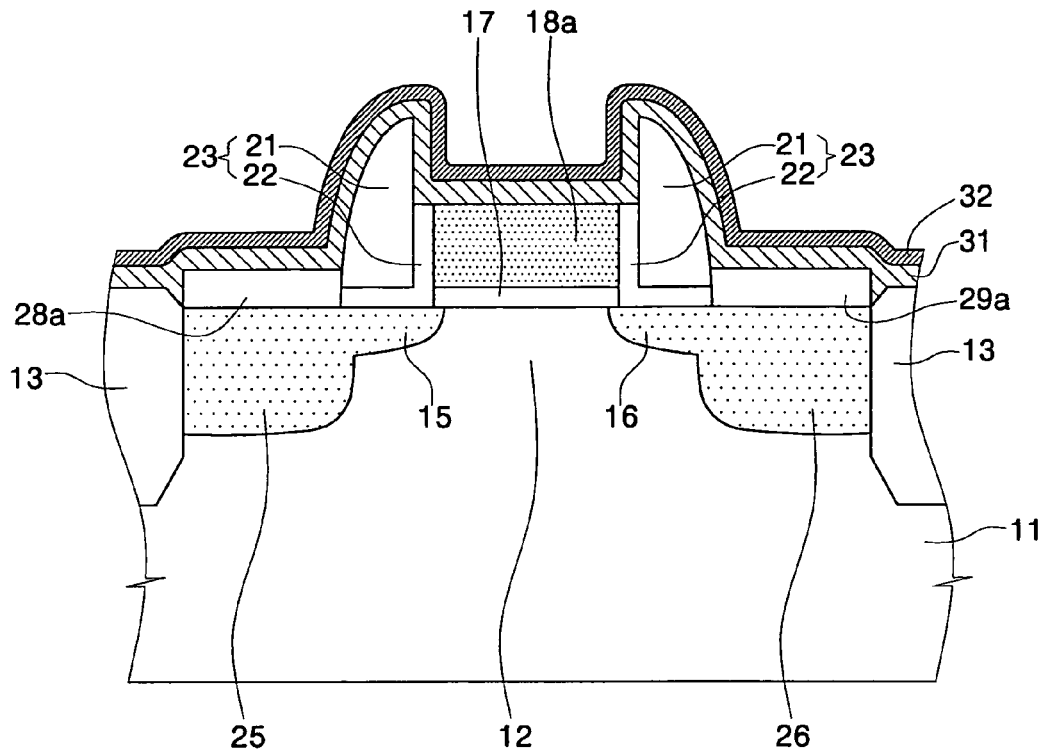

Referring to FIG. 7, the surface of the semiconductor substrate where the gate-reduced pattern 18a is already formed is subjected to a cleaning process to remove a native oxide layer and contaminated particles which remain on the elevated source and drain regions 28a and 29a. The cleaning process may be performed such that a first cleaning step is carried out using a wet cleaning solution containing HF and a second cleaning step is carried out using a solution mixed with $NH_4OH$, $H_2O_2$ and $H_2O$.

A metal layer 31 and a capping layer 32 are sequentially formed on the entire surface of the cleaned semiconductor substrate. The metal layer 31 may be formed of one material selected from a group consisting of nickel (Ni), cobalt (Co), tungsten (W,) tantalum (Ta), and titanium (Ti), or may be formed of an alloy layer containing at least two materials selected from the group. The metal layer 31 may be formed by a physical vapor deposition (PVD) method. In addition, the capping layer 32 may be formed of a TiN layer. In this case, the TiN layer serves to prevent the metal layer 31 from being oxidized. Alternatively, the formation of the capping layer 32 may be omitted.

Figure 8:
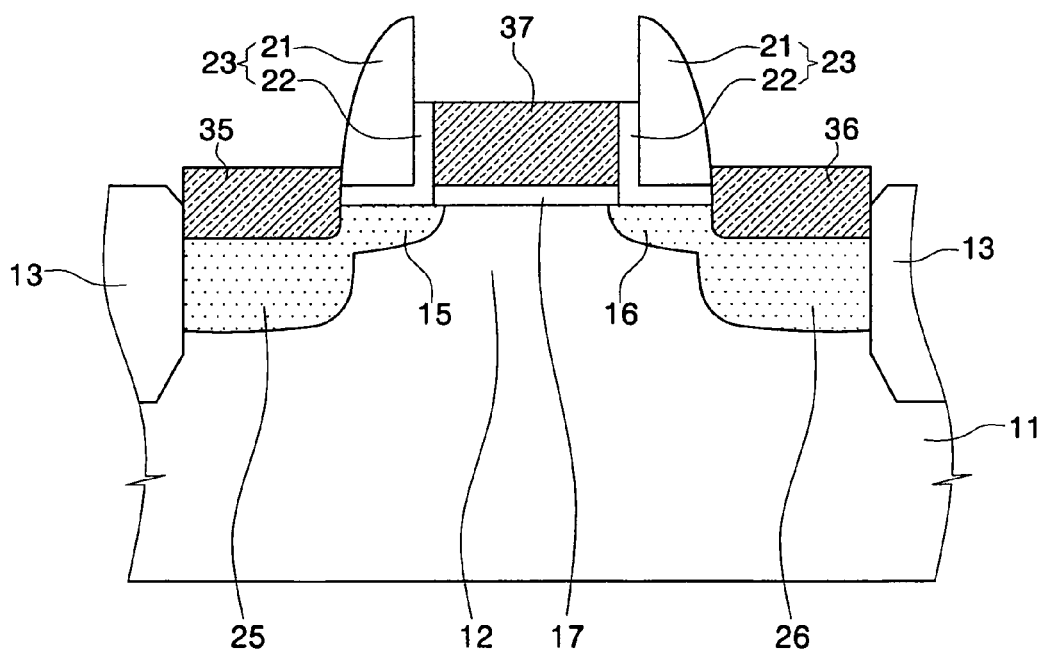

Referring to FIG. 8, a silicidation process is applied to the semiconductor substrate having the metal layer 31. The silicidation process includes annealing the semiconductor substrate having the metal layer 31 until the gate-reduced pattern 18a is fully silicided. The annealing may be carried out at a temperature in a range of 400° C. to 500° C. when the metal layer 31 is Ni. In addition, the annealing may be divided into a first annealing step and a second annealing step. The metal layer 31 reacts with silicon atoms within the gate-reduced pattern 18a, the elevated source and drain regions 28a and 29a, and the source and drain regions 25 and 26 while the annealing is carried out.

Consequently, the gate-reduced pattern 18a is fully silicided to be a fully silicided metal gate electrode 37. At the same time, the elevated source and drain regions 28a and 29a and some regions of the source and drain regions 25 and 26 are also silicided to be source and drain silicide layers 35 and 36. The source and drain silicide layers 35 and 36 are formed to be protruded from the surface of the semiconductor substrate. That is, elevated source and drain silicide layers 35 and 36 are formed. It is preferable to form the elevated source and drain silicide layers 35 and 36 to be shallower than the junction depths of the source and drain regions 25 and 26.

Subsequently, the metal layer 31 which was unreacted on the spacer 23 and the isolation layer 13 is removed. The unreacted metal layer 31 may be removed using a solution mixed with sulfuric acid ($H_2SO_4$) and hydrogen peroxide ($H_2O_2$). The capping layer 32 may also be stripped while the unreacted metal layer 31 is removed.

FIG. 9 and FIG. 10 are cross-sectional views illustrating a method of fabricating a MOS transistor having a fully silicided metal gate electrode in accordance with other embodiments of the present invention.

Referring to FIG. 9, by the same method as that described in the embodiments with reference to FIG. 3 and FIG. 4, an isolation layer 13 is formed in a predetermined region of a semiconductor substrate 11 to define an active region 12. An insulated gate pattern 18 is formed to cross over the active region 12. First impurity ions are implanted into the active region 12 using the gate pattern 18 and the isolation layer 13 as ion implantation masks to form LDD regions 15 and 16. Spacers 23 are formed on sidewalls of the gate pattern 18. Second impurity ions are implanted into the active region 12 using the gate pattern 18, the spacers 23, and the isolation layer 13 as ion implantation masks to form source and drain regions 25 and 26. As a result, the LDD regions 15 and 16 remain below the spacers 23. The surface of the semiconductor substrate where the source and drain regions 25 and 26 are already formed is subjected to a cleaning process to remove a native oxide layer and contaminated particles which remain on the source and drain regions 25 and 26. The cleaning process may be performed such that a first cleaning step is carried out using a wet cleaning solution in which HF is contained and a second cleaning step is carried out using a solution mixed with $NH_4OH$, $H_2O_2$ and $H_2O$.

A selective etching process may be performed on the cleaned semiconductor substrate to form a lower gate-reduced pattern 48 and recessed source and drain regions 25 and 26. The selective etching process may be carried out using a CVD apparatus. The selective etching process may be carried out using HCl and $H_2$ gases as reaction gases under conditions of 700° C. to 1000° C. in temperature and 10 torr to 600 torr in pressure. The selective etching process may allow the temperature, the pressure, and the reaction gases to be adjusted to thereby change an etch selectivity between a single-crystalline semiconductor layer and a poly-crystalline semiconductor layer. The HCl gas may be supplied at a flow of 300 sccm to 1500 sccm. For example, when a HCl gas of 300 sccm is supplied under conditions of 780° C. in temperature and 550 torr in pressure, an etch selectivity of one to five may be obtained between the single-crystalline semiconductor layer and the poly-crystalline semiconductor layer. That is, the poly-crystalline semiconductor layer is etched five times faster than the single-crystalline semiconductor layer.

Consequently, by means of the selective etching process, the gate pattern 18 composed of the poly-crystalline semiconductor layer is etched to be the lower gate-reduced pattern 48, and upper regions of the source and drain regions 25 and 26 composed of the single-crystalline semiconductor layer are also etched to be recessed at the same time. In this case, the etch selectivity between the single-crystalline semiconductor layer and the poly-crystalline semiconductor layer may be used to obtain a desired thickness of the lower gate-reduced pattern 48 composed of the poly-crystalline semiconductor layer and desired depths of the recessed source and drain regions 25 and 26 composed of the single-crystalline semiconductor layer. In this case, it is preferable to form the recess depths of the recessed source and drain regions 25 and 26 to be shallower than the junction depths of the source and drain regions.

Referring to FIG. 10, a selective epitaxial growth process is performed on the semiconductor substrate where the lower gate-reduced pattern 48 and the recessed source and drain regions 25 and 26 are already formed to form an upper gate pattern 49 and elevated source and drain regions 58 and 59. In this case, single-crystalline semiconductor layers are formed on the recessed source and drain regions 25 and 26 while a poly-crystalline semiconductor layer is concurrently formed on the lower gate-reduced pattern 48.

The selective epitaxial growth process may be carried out as an in-situ process. That is, it is preferable to perform the selective epitaxial growth process continuously using the CVD apparatus which was employed while the selective etching process was carried out.

The upper gate pattern 49 and the elevated source and drain regions 58 and 59 may be formed of at least one material selected from a group consisting of Si, SiGe, SIC, C doped SiGe, P doped SiGe, and B doped SiGe.

In addition, the selective etching process and the selective epitaxial growth process may be performed at least two times to form respective desired thicknesses of the upper gate pattern 49 and the elevated source and drain regions 58 and 59.

Next, by the same method as that described in the embodiments with reference to FIG. 7 and FIG. 8, a fully silicided metal gate electrode 37 and source and drain silicide layers 35 and 36 are formed. That is, the lower gate-reduced pattern 48 and the upper gate pattern 49 are fully silicided through the silicidation process to be the fully silicided metal gate electrode 37. At the same time, the elevated source and drain regions 58 and 59 are also silicided to be the elevated source and drain silicide layers 35 and 36. It is preferable to form the elevated source and drain silicide layers 35 and 36 which are formed in this case to be shallower than the junction depths of the source and drain regions 25 and 26.

According to the present invention as mentioned above, a selective epitaxial growth process and a selective etching process are used in the same equipment to form a gate-reduced pattern and elevated source and drain regions, and then to form a fully silicided metal gate electrode and elevated source and drain silicide layers through a silicidation process. The selective etching process uses an etch selectivity between a poly-crystalline semiconductor layer and a single-crystalline semiconductor layer, so that respective desired thicknesses of the gate-reduced pattern and the elevated source and drain regions may be adjusted. Accordingly, it may prevent a deep silicide layer from being formed in the source and drain regions while the fully silicided metal gate electrode is formed. That is, the elevated source and drain silicide layers may be formed in regions shallower than the source and drain junction depths. As a result, a MOS transistor having a fully silicided metal gate electrode which is highly integrated and has good performance may be fabricated.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a metal oxide semiconductor (MOS) transistor, comprising:

forming an isolation layer in a predetermined region of a semiconductor substrate to define an active region;

forming an insulated gate pattern which crosses over the active region;

forming a spacer on sidewalls of the gate pattern;

forming source and drain regions in the semiconductor substrate and annealing the gate pattern and source and drain regions;

forming a poly-crystalline semiconductor layer on the annealed gate pattern and a single-crystalline semiconductor layer on the annealed source and drain regions using a selective epitaxial growth process;

selectively etching the semiconductor layers to form a gate-reduced pattern and elevated source and drain regions on the source and drain regions, wherein the selective etching is carried out using HCl and $H_2$ gases as reaction gases; and applying a silicidation process where the gate-reduced pattern is formed to simultaneously form a fully silicided metal gate electrode and elevated source and drain silicide layers.

2. The method as recited in claim 1, wherein the semiconductor substrate is one of a silicon substrate, a silicon-on-insulator (SOI) substrate, and a strained silicon substrate.

3. The method as recited in claim 1, wherein the gate pattern is formed of a poly-crystalline semiconductor layer.

4. The method as recited in claim 1, further comprising implanting first impurity ions into the active region using the gate pattern and the isolation layer as ion implantation masks to form lightly doped drain (LDD) regions after forming the insulated gate pattern.

5. The method as recited in claim 1, wherein the spacer is formed of at least one material layer selected from a group consisting of a silicon oxide layer, a silicon nitride (SIN) layer, and a silicon oxynitride (SiON) layer.

6. The method as recited in claim 1, further comprising implanting second impurity ions into the active region using the gate pattern, the spacer, and the isolation layer as ion implantation masks to form the source and drain regions after forming the spacer on the sidewalls of the gate pattern.

7. The method as recited in claim 6, further comprising annealing the semiconductor substrate in a chamber to which a $H_2$ gas is supplied at a temperature of 800° C. to 1000° C. after forming the source and drain regions.

8. The method as recited in claim 1, wherein the selective epitaxial growth process is carried out using a chemical vapor deposition (CVD) apparatus.

9. The method as recited in claim 1, wherein the semiconductor layers are formed of at least one material selected from a group consisting of silicon (Si), silicon germanium (SiGe), silicon carbide (SiC), carbon (C) doped silicon germanium (SiGe), phosphor (P) doped SiGe, and boron (B) doped SiGe.

10. The method as recited in claim 1, wherein the selective epitaxial growth process and the selective etching process are carried out in the same apparatus.

11. The method as recited in claim 1, wherein the selective epitaxial growth process and the selective etching process are carried out at least once to form the gate-reduced pattern and the elevated source and drain regions.

12. The method as recited in claim 1, wherein applying the silicidation process to the semiconductor substrate where the gate-reduced pattern is formed to simultaneously form the fully silicided metal gate electrode and the elevated source and drain silicide layers, include:

forming a metal layer on an entire surface of the semiconductor substrate where the gate-reduced pattern is formed;

annealing the semiconductor substrate until the gate-reduced pattern is fully silicided; and removing a metal layer which was unreacted on the spacer and the isolation layer.

13. The method as recited in claim 12, wherein the metal layer is formed of one material selected from a group consisting of nickel (Ni), cobalt (Co), tungsten (W), tantalum (Ta), titanium (Ti), and an alloy layer containing at least two materials selected from the group.

14. The method as recited in claim 1, wherein the elevated source and drain silicide layers are formed to be protruded from a surface of the semiconductor substrate.

15. A method of fabricating a metal oxide semiconductor (MOS) transistor, comprising:

forming an insulated gate pattern on a semiconductor substrate;

forming a spacer on sidewalls of the gate pattern;

forming source and drain regions in the semiconductor substrate and annealing the gate pattern and source and drain regions;

forming a poly-crystalline semiconductor layer on the annealed gate pattern and a single-crystalline semiconductor layer on the annealed source and drain regions using a selective epitaxial growth process;

selectively etching the semiconductor layers to form a gate-reduced pattern and elevated source and drain regions on the source and drain regions; and applying a silicidation process where the gate-reduced pattern is formed to simultaneously form a fully silicided metal gate electrode and elevated source and drain silicide layers.

* * * * *

UNITED STATES PATENT AND TRADEMARK OFFICE
CERTIFICATE OF CORRECTION

PATENT NO.       : 7,582,535 B2
APPLICATION NO. : 11/158978
DATED            : September 1, 2009
INVENTOR(S)      : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 363 days.

Signed and Sealed this

Fourteenth Day of September, 2010

David J. Kappos
*Director of the United States Patent and Trademark Office*